United States Patent [19]
McKee et al.

[11] Patent Number: 6,080,235
[45] Date of Patent: *Jun. 27, 2000

[54] GEOMETRIC SHAPE CONTROL OF THIN FILM FERROELECTRICS AND RESULTING STRUCTURES

[75] Inventors: Rodney A. McKee, Kingston; Frederick J. Walker, Oak Ridge, both of Tenn.

[73] Assignee: UT-Battelle, LLC, Oak Ridge, Tenn.

[ * ] Notice: This patent is subject to a terminal disclaimer.

[21] Appl. No.: 08/868,076

[22] Filed: Jun. 3, 1997

[51] Int. Cl.[7] .................................................. C30B 33/04
[52] U.S. Cl. ...................... 117/2; 117/3; 117/4; 423/593
[58] Field of Search ..................... 117/2, 3, 4; 423/593

[56] References Cited

U.S. PATENT DOCUMENTS

| | | | |
|---|---|---|---|
| 5,058,250 | 10/1991 | Turnbull | 29/25.35 |
| 5,225,031 | 7/1993 | McKee et al. | |
| 5,295,218 | 3/1994 | Agostinelli et al. | 385/122 |
| 5,450,812 | 9/1995 | McKee et al. | |
| 5,576,879 | 11/1996 | Nashimoto | 359/248 |
| 5,654,229 | 8/1997 | Leplingard et al. | 117/56 |
| 5,666,305 | 9/1997 | Mihara et al. | 365/145 |
| 5,830,270 | 11/1998 | McKee et al. | 117/106 |

OTHER PUBLICATIONS

Wu et al., "Domain Structure and Polarization reversal in films of ferroelectric bismuth titanate", ferroelectrics, vol. 3, pp. 217–224, 1972.

Primary Examiner—Robert Kunemund
Attorney, Agent, or Firm—Michael E. McKee; George L. Craig; Joseph A. Marasco

[57] ABSTRACT

A monolithic crystalline structure and a method of making involves a semiconductor substrate, such as silicon, and a ferroelectric film, such as $BaTiO_3$, overlying the surface of the substrate wherein the atomic layers of the ferroelectric film directly overlie the surface of the substrate. By controlling the geometry of the ferroelectric thin film, either during build-up of the thin film or through appropriate treatment of the thin film adjacent the boundary thereof, the in-plane tensile strain within the ferroelectric film is relieved to the extent necessary to permit the ferroelectric film to be poled out-of-plane, thereby effecting in-plane switching of the polarization of the underlying substrate material. The method of the invention includes the steps involved in effecting a discontinuity of the mechanical restraint at the boundary of the ferroelectric film atop the semiconductor substrate by, for example, either removing material from a ferroelectric film which has already been built upon the substrate, building up a ferroelectric film upon the substrate in a mesa-shaped geometry or inducing the discontinuity at the boundary by ion beam deposition techniques.

21 Claims, 5 Drawing Sheets

GEOMETRIC SHAPE CONTROL OF THIN FILM FERROELECTRICS AND RESULTING STRUCTURES

This invention was made with Government support under Contract No. DE-AC05-96OR22464 awarded by the U.S. Department of Energy to Lockheed Martin Energy Research Corporation, and the Government has certain rights in the invention.

BACKGROUND OF THE INVENTION

This invention relates generally to structures involving the growth of epitaxial thin-films upon semiconductor-based materials and relates, more particularly, to such structures having thin films grown thereon which possess desirable ferroelectric properties.

It is known that a thin-film layer of a ferroelectric material, such as $BaTiO_3$, can be grown directly upon a semiconductor-based material, such as silicon, to render a monolithic structure which possesses both semiconductor and ferroelectric properties. For example, applicants have described the growth of such a material in their co-pending application Ser. No. 08/692,343, filed Aug. 5, 1996, wherein the build up of the ferroelectric material directly upon a semiconductor-based material, such as silicon, is effected one-plane-at-a-time wherein each plane contains one of two selected constituent metal oxide planes of the crystalline form of the ferroelectric material.

Heretofore, however, there does not exist such a structure which incorporates a ferroelectric material and a silicon substrate wherein the ferroelectric material can be poled out-of-plane thereby enabling the in-plane switching of the underlying silicon. It would be desirable, therefore, to provide a monolithic structure comprised of a film of ferroelectric material disposed upon a semiconductor-based substrate, such as silicon, wherein the ferroelectric material is capable of being poled out-of-plane.

Accordingly, it is an object of the present invention to provide a structure wherein a ferroelectric thin film is disposed upon a semiconductor-based material, such as silicon, and wherein the thin film of ferroelectric material is capable of being poled out-of-plane and a method of treating and/or forming a ferroelectric thin film atop a semiconductor substrate which is capable of being poled out-of-plane.

Another object of the present invention is to provide such a structure wherein the geometric shape of the thin film of ferroelectric material advantageously affects the ferroelectric characteristics of the thin film.

Still another object of the present invention is to provide a structure whose ferroelectric thin film is comprised of a plurality of islands of thin film material disposed across the surface of the semiconductor-based material.

SUMMARY OF THE INVENTION

This invention resides in a crystalline structure involving a ferroelectric thin film disposed atop a semiconductor substrate wherein at least one region of the thin film is capable of being poled out-of-plane and a process for producing the structure.

One embodiment of the crystalline structure of the invention includes a semiconductor substrate having a surface and a ferroelectric film overlying the surface of the substrate wherein the ferroelectric film consists of an $ABO_3$ material having at least one AO constituent plane and at least one $BO_2$ constituent plane. The ferroelectric film is arranged upon the surface of the substrate so that a first single plane consisting of a single atomic layer of said AO constituent of the $ABO_3$ material overlies the surface of the substrate and a second single plane consisting of a single atomic layer of said $BO_2$ constituent of the $ABO_3$ material overlies the first single plane of AO.

One embodiment of the process of the invention involves the treating of a ferroelectric thin film situated directly atop a semiconductor surface to render the film capable of being poled out-of plane. More specifically, a region of the ferrolectric thin film is selected, and then the continuity of the mechanical restraint adjacent the boundary of the preselected region is affected to relieve the in-plane tensile strain within the preselected region.

Another embodiment of the process involves the formation of a ferroelectric thin film into a mesa-shaped geometry situated directly atop a semiconductor surface. More specifically, a semiconductor having a surface is provided, and areas of the surface of the semiconductor substrate upon which no ferroelectric thin film is desired to be grown directly thereupon are covered. The covered areas of the semiconductor surface are shaped so that a region of the substrate surface left uncovered by this step corresponds with the desired cross sectional shape of the mesa-shaped geometry of the ferroelectric film. A ferroelectric thin film is then grown upon the entire semiconductor surface so that the grown thin film directly contacts the surface of the semiconductor substrate in the regions thereof left uncovered by the covering step. The covered areas of the substrate surface are subsequently uncovered so that the only ferroelectric film which remains atop the substrate surface is that which directly contacts the surface of the substrate surface.

DETAILED DESCRIPTION OF AN ILLUSTRATIVE EMBODIMENT

Figure 1:
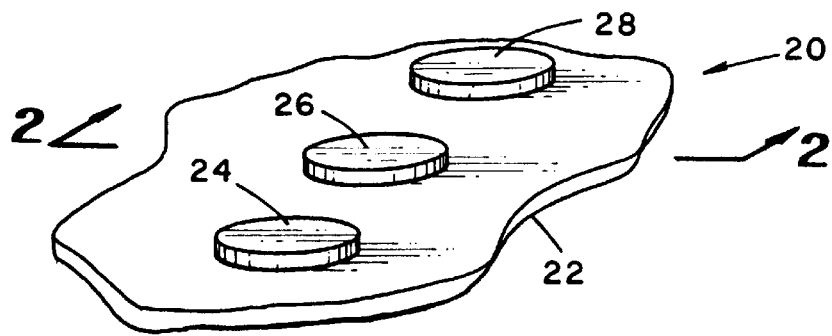
FIG. 1 is a perspective view of a fragment of a wafer comprised of a silicon substrate and a plurality of mesa-shaped islands of $BaTiO_3$ disposed across the surface of the substrate.
Figure 2:
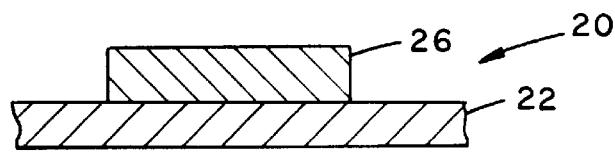
FIG. 2 is a transverse cross-sectional view of the FIG. 1 wafer taken about line 2—2 of FIG. 1.

Turning now to the drawings in greater detail, there is shown in FIG. 1 a monolithic crystalline structure, generally indicated 20, comprised of a substrate 22 of silicon and a plurality of free-standing mesa-shaped islands 24, 26 and 28 of the perovskite $BaTiO_3$ disposed across the surface of the substrate 22. $BaTiO_3$ is a ferroelectric oxide material which when combined with the silicon substrate 22 in the form of an overlying thin film enables the crystalline structure 20 to take advantage of the semiconductor, as well as the ferroelectric properties, of the structure 20. Each mesa-shaped island 24, 26 or 28 of the structure 20 has the capacity to be poled out-of-plane, thereby enabling the switching of the polarization of the underlying silicon. As will be explained herein, the capacity of the ferroelectric thin film to be poled out-of-plane is affected by the geometry of the thin film, and accordingly, the geometry of each mesa 24, 26 or 28 of thin film is controlled during its growth (or formation) so that the resulting thin film is capable of being poled out-of-plane as aforedescribed.

Although the structure 20 is described herein as including a commensurate film of $BaTiO_3$, a ferroelectric film-including structure in accordance with the broader aspects of this invention does not require commensurate periodicity to render its ferroelectric film capable of being poled out-of-plane. As is apparent herein, it is the geometric influence, rather than the commensurate periodicity, that attends selected regions of the ferroelectric film which advantageously affects the capacity of these selected regions to be poled out-of-plane. Accordingly, the principles of the present invention can be variously applied.

Figure 3:
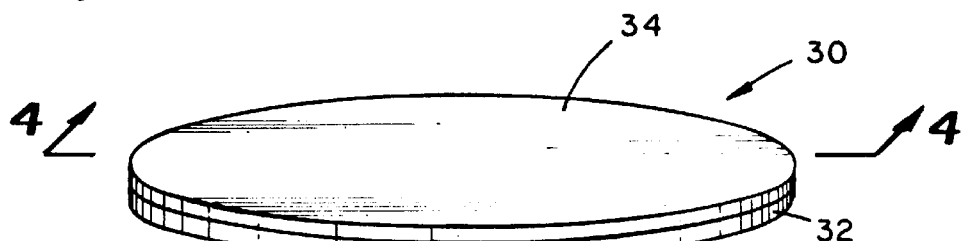
FIG. 3 is a perspective view of an alternative wafer comprised of a silicon substrate and a thin film of $BaTiO_3$ which covers the entire surface of the substrate.
Figure 4:
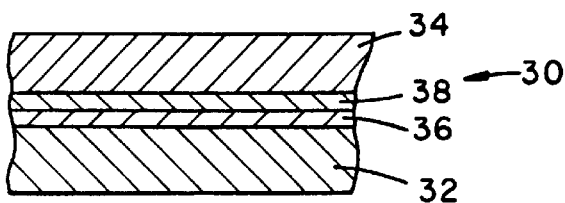
FIG. 4 is a fragmentary cross-sectional view taken about along line 4—4 of FIG. 3.

For purposes of comparison, there is shown in FIGS. 3 and 4 a monolithic crystalline structure, generally indicated 30, comprised of a silicon wafer 32 having a broad commensurate film 34 of $BaTiO_3$ grown directly upon the surface of the silicon 32 so that the film 34 covers substantially the entire area of the silicon 32 in somewhat of a plateau configuration. A process used to construct the structure 30 is set forth in applicants' co-pending U.S. application Ser. No. 08/692,343, filed Aug. 5, 1996 and the disclosure of which is incorporated herein by reference, so that a detailed description of the construction process is not believed to be necessary. Briefly, however, and with reference to FIG. 4, steps are taken to cover the surface of the wafer 32 with a thin alkaline earth oxide film 36 of $Ba_{0.725}Sr_{0.275}O$, then to cover the film 36 with a thin perovskite (template) film 38 of $Ca_{0.64}Sr_{0.36}TiO_3$, and then to cover the film 38 with the desired (multi-stratum) film 34 of $BaTiO_3$ to provide the resultant structure 30.

Each of the alkaline earth oxide film 36 and the template film 38 and an appreciable portion of the $BaTiO_3$ film 40 is constructed in somewhat of a single plane-layer-by-single plane-layer fashion to ensure commensurate periodicity throughout the build up of the structure 30 and wherein the layer-construction processes take into account the crystalline form of the material out of which the film is desired to be constructed. For a more detailed description of the construction of the film 34 directly atop the surface of the silicon wafer 20, reference can be had to the co-pending U.S. application Ser. No. 08/692,343. As will be apparent herein, the construction of the $BaTiO_3$ film directly upon the surface of the silicon 32 in the manner described in the referenced application is distinguishable from the construction of the $BaTiO_3$ film upon the wafer 32 with the use of an intermediate film of MgO interposed between the wafer 32 and the $BaTiO_3$ film 40, as is described applicants' co-pending application Ser. No. 08/681,880, filed Jul. 29, 1996.

During the process of constructing structures whose composition is comparable to that of the structure 30 of FIGS. 3 and 4, applicants have discovered that the differences between the coefficients of thermal expansion (i.e. linear thermal expansion) of the constituents of the structure strongly affect the ferroelectric characteristics of the resultant structure. In this regard, the coefficient of thermal expansion of silicon is smaller than that of $BaTiO_3$ so that a uniform heating (or cooling) of the resultant structure results in a tendency of the $BaTiO_3$ film to misshapen, as will be described herein, and the tendency for an appreciable in-plane strain to develop within the $BaTiO_3$ film.

Applicants have discovered, however, that the relative thermal expansion (or contraction) between silicon and $BaTiO_3$ is of less consequence during the build-up of the film than it is when the film is subsequently cooled during a cool-down period following the deposition of the $BaTiO_3$ film atop the silicon. In this connection, the steps involving the deposition of $BaTiO_3$ are carried out at a relatively high temperature of about 600° C., and at this temperature, the deposited film of $BaTiO_3$ is substantially free of in-plane strain. Following this deposition process, however, the resulting structure is subsequently cooled to a lower temperature, such as about 40° C. or room temperature, and it is during this cooling process that the differences in thermal expansion (or contraction) characteristics between the silicon and the $BaTiO_3$ come into play.

More specifically, as the resultant structure is cooled as aforedescribed, the differences in thermal expansion (or contraction) of the $BaTiO_3$ film and the silicon effects a greater shrinkage of the $BaTiO_3$ film than the silicon. In other words, as the resultant structure is cooled from the deposition temperature of about 600° C., the number of $BaTiO_3$ unit cells per unit area at the $Si/BaTiO_3$ interface remain proportional to the number of Si unit cells per unit area at the $Si/BaTiO_3$ interface while the atoms of the $BaTiO_3$ film tend to move closer together than do the atoms of the silicon substrate. As the $BaTiO_3$ film attempts to contract; more than the silicon, it is constrained by the constraint of the film of $BaTiO_3$ at the $Si/BaTiO_3$ interface. Thus, upon reaching the lower temperature, e.g. room temperature, the $BaTiO_3$ film is constrained to a larger in-plane area than it would otherwise if it were not so constrained. Consequently, the contraction of the $BaTiO_3$ film effects a shortening of the out-of-plane lattice parameter of the $BaTiO_3$ film as a path is traced therethrough from the surface of the silicon.

Figure 6:
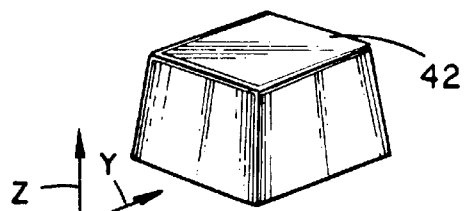
FIG. 6 is a schematic perspective view of the cubic unit cell of FIG. 5 which has been misshapened due to strain.
Figure 5:
FIG. 5 is a schematic perspective of an undeformed cubic unit cell of $BaTiO_3$.

As the lattice parameter tends to reduce in size as a path is traced through the aforementioned transition layers, the lattice of the $BaTiO_3$ film is exposed to an appreciable amount of biaxial tensile strain induced within the plane of the layers of the film, i.e. in a plane generally parallel to the surface of the silicon, as well as along the sides of the lattice, i.e. along a path normal to the surface of the silicon. With reference to FIGS. 5 and 6 wherein a unit cell of $BaTiO_3$ is denoted 42, this induced strain tends to misshapen the form of the $BaTiO_3$ unit cell from a cubic form, as depicted in FIG. 5, to the somewhat distorted cubic form as unit cell crystal has a top which possesses an area which is slightly smaller than the area of its base.

Figure 7:
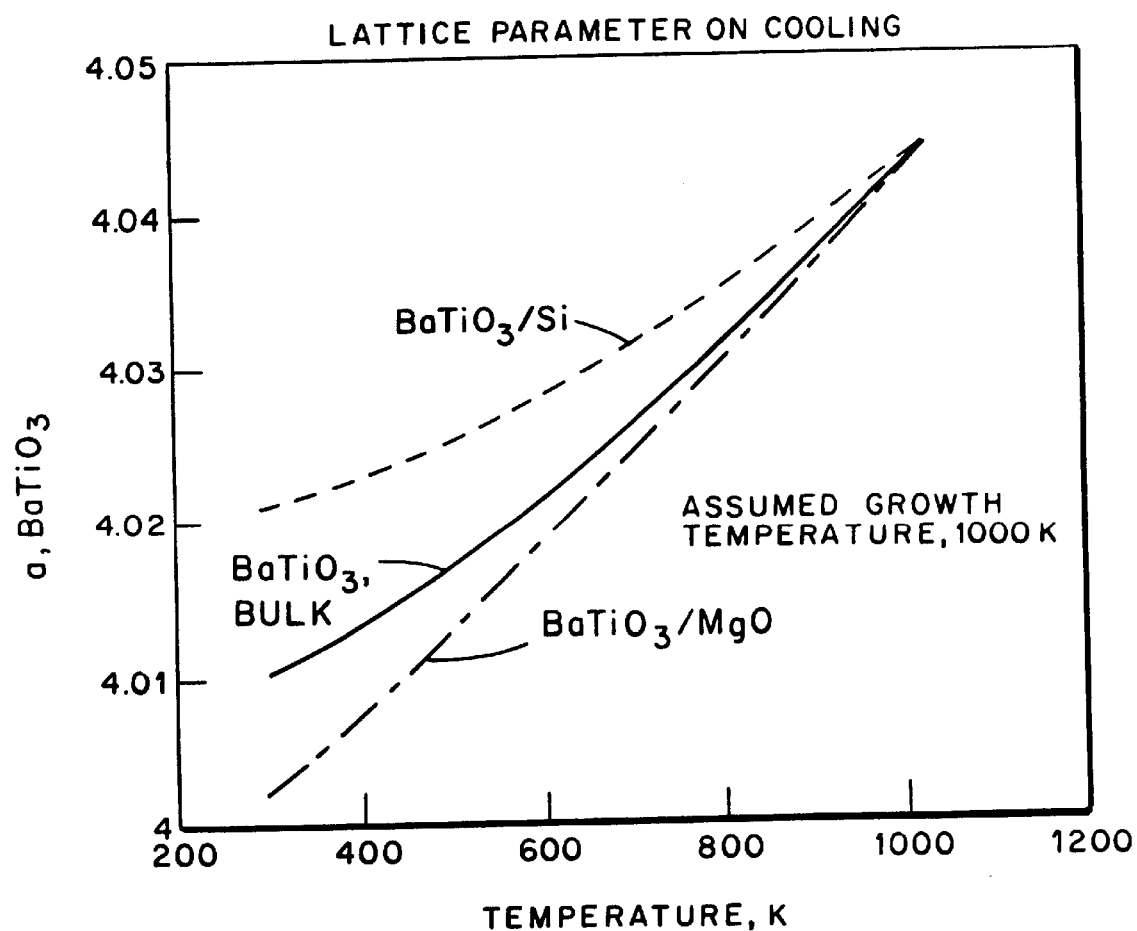
FIG. 7 is a graph plotting lattice parameters of $BaTiO_3$-including structures as a function of temperature.

With reference to FIG. 7, there is shown a plot of the lattice parameter of $BaTiO_3/Si$, bulk $BaTiO_3$, and $BaTiO_3/MgO$ structures as a function of temperature. It can be seen that the lattice parameter of each structure decreases as the structure temperature decreases, but that the lattice parameter of $BaTiO_3/Si$ does not decrease as much as does the bulk $BaTiO_3$ or $BaTiO_3/MgO$ structures. Such a phenomena can be explained in that during a cooling of each of the respective structures, the lattice of Si does not permit the lattice parameter of $BaTiO_3$ to reduce to the extent permitted during the cooling of bulk $BaTiO_3$ or by the lattice of MgO.

Figure 8:
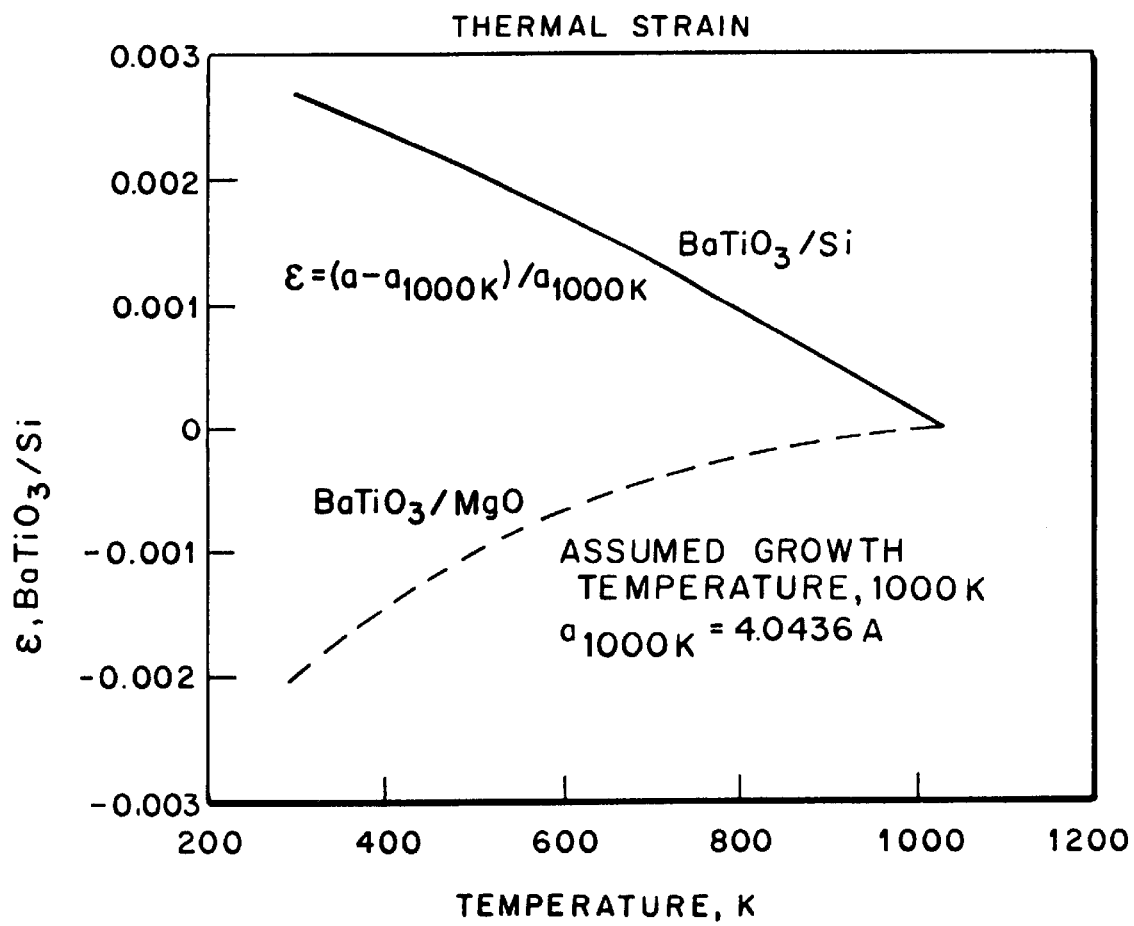
FIG. 8 is a graph plotting thermal strain of $BaTiO_3$ when grown on Si and MgO, respectively, as a function of temperature.

Along the same lines, there is shown in FIG. 8 a plot of the in-plane thermal strain induced upon a thin film of BaTiO₃ grown upon a substrate of silicon and upon a thin film of BaTiO₃ grown upon MgO versus the temperature of the structure. Generally, the in-plane strain induced within the BaTiO₃ film of the BaTiO₃/Si structure increases as the temperature falls from a temperature of about 1030° K. By comparison, it can be seen that below the temperature of about 1030° K., the in-plane thermal strain induced upon the thin film of BaTiO₃ grown upon MgO is negative, thus evidencing that the BaTiO₃ is in a compressive, rather than a tensile-strained, state within this structure.

As is the case with a cubic unit cell of an unpoled ferroelectric material, such as the cubic BaTiO₃ unit cell 42 schematically illustrated in FIG. 5, there exists an electric dipole moment which may be oriented along any of three (X, Y or Z) coordinate axes. The application of a sufficient electric field across the unit cell will normally pole the dipole moment of the unit cell to a particular (i.e. X, Y or Z) orientation. However, within applicants' BaTiO₃/Si test samples whose construction is comparable to that of the structure 30 of FIGS. 3 and 4 (i.e. a construction wherein the BaTiO₃ film spans the entire surface of the broad Si substrate in a plateau configuration), the BaTiO₃ film could not be poled out-of-plane, no matter what electric field was applied between the upper and lower surfaces of the sample. Such an inability to switch the dipole moments out-of-plane under these circumstances led applicants to conclude that the aforedescribed in-plane strain of the BaTiO₃ film had a predictable effect on the dipole moments of the crystals of the BaTiO₃ film. More specifically, whereas in an unpoled and unstrained film of BaTiO₃, the dipole moments may be oriented (in a substantially equal distribution) along each of the three (i.e. X, Y and Z) coordinate axes in a substantially equal distribution, the distribution of the dipole moments of an unpoled film of BaTiO₃ film whose unit cell are Exposed to the aforedescribed biaxial state of tension (i.e. along the indicated X and Y coordinate axes) is weighed heavily in favor of the dipole moments being oriented along the indicated X and Y axes. In other words, this biaxial strain to which the BaTiO₃ film of the FIG. 3 structure 30 is exposed tends to prevent the orientation of dipole moments in the BaTiO₃ film along the indicated Z-coordinate axis so that the dipole moments of the BaTiO₃ film are predominately oriented along either of the X and Y axes (and are generally constrained within the X-Y plane by the biaxial strain to which the BaTiO₃ film is exposed).

Applicants discovered that by separating adjacent regions of the BaTiO₃ film from one another (and thereby effecting a discontinuity in the in-plane mechanical restraint between adjacent regions of the film), the interior region of BaTiO₃ could be poled out-of-plane with the application of an appropriate electric field between the upper surface of the interior BaTiO₃ region and lower surface of the Si substrate. By effecting, or inducing, such a discontinuity between the adjacent regions of the BaTiO₃ film, the constraint exhibited upon the BaTiO₃ film of one (interior) region by the BaTiO₃ film by its surrounding region is mitigated, thereby relieving the in-plane strain of the interior region of the BaTiO₃ film. Without relief of such in-plane strain, the strength of the in-plane mechanical restraint through the BaTiO₃ film is simply too robust to permit the dipole moments of the BaTiO₃ film to switch out-of-plane.

To substantiate their discovery of the correlation between the ferroelectric characteristics of a BaTiO₃ film constructed directly atop a silicon substrate, applicants constructed and tested a sample of BaTiO₃/Si, like that of the structure 20 of FIG. 1, wherein the BaTiO₃ film was separated into island-like mesa-shaped geometries disposed across the surface of the silicon. With a view toward testing the ferroelectric switching effects of mesas having different widths, a sample including four mesas having widths of 24 μm, 28 μm, 32 μm and 55 μm was constructed.

Figure 9:
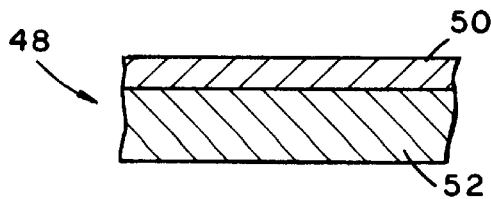
FIGS. 9–16 are schematic transverse cross-sectional views of a $BaTiO_3/Si$ test sample under construction in accordance with a method of the present invention.
Figure 10:
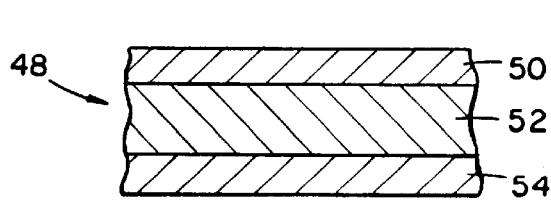

In the following description of the construction of the four-mesa BaTiO₃/Si sample, a known technique called wet chemistry photolithography is used to remove selected portions of a BaTiO₃ film (which has been constructed upon a silicon substrate) from a thin film of BaTiO₃ film so that the desired mesa-shaped regions of the BaTiO₃ film remain atop the silicon substrate. Accordingly and with reference to FIG. 9, the steps involved in making the aforedescribed four-mesa BaTiO₃/Si sample for testing began with a BaTiO₃/Si wafer 48 (like that of the FIG. 3 structure 30) wherein a commensurate thin film 50 of BaTiO₃ is constructed directly upon the surface of a (100) silicon substrate 52 to a height of about 250 angstroms and spans the entire surface of this substrate 52. With a view toward applying an electric field between the underside of the silicon substrate 52 and the upper surface of each mesa of BaTiO₃ film 50, a thin film 54 (best shown in FIG. 10) of aluminum is vapor-deposited upon the underside of the wafer 48 (i.e. on the silicon-side thereof). This aluminum film 54 establishes ohmic contact on the underside of the wafer 48. Within this test sample, the aluminum film 54 was deposited to a depth of about 2000 angstroms. Following deposition of the aluminum film 54, the wafer 48 (with the aluminum thin film 54 deposited thereon) is annealed at 500° C. for about five minutes.

Figure 11:
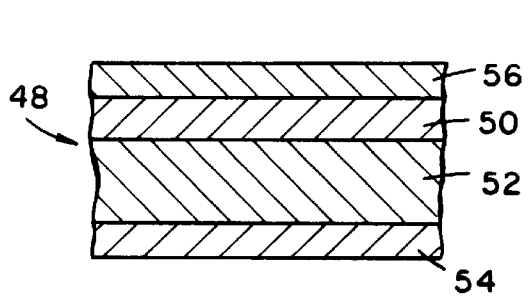

Following the deposition and annealing of the aluminum film 54, a second aluminum thin film 56 (best shown in FIG. 11) is vapor-deposited upon the front of the wafer 48 or, more specifically, upon the top surface of the BaTiO₃ film 50. The aluminum film 56 in this sample was grown to a depth of about 2000 angstroms and provides an electrical contact on the upper surface of the BaTiO₃ film 50.

Figure 12:
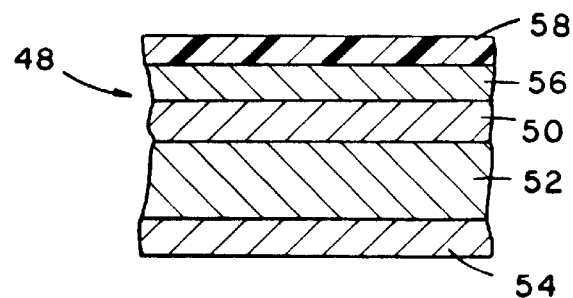

With reference to FIG. 12, a layer 5E of a photoresist material is then coated upon the top surface of the deposited aluminum thin film 56. Photo resist is an inorganic compound (somewhat plastic in nature) that can be purposely damaged, i.e. broken-down, by exposure to ultraviolet light. In one method of applying the photo-resist layer 58 atop the aluminum film 56, the photo resist is poured upon the upper surface of the aluminum film 56 while the wafer 48 is spun upon a turntable (not shown) so that the resulting layer 58 of photo resist is distributed to a relatively even depth across the surface of the aluminum film 56.

The photo resist layer 58 is then exposed to ultraviolet (UV) light from an appropriate source to purposely damage selected regions of the layer 58 while leaving intact the regions of the photo resist layer which directly overlie the areas of the BaTiO₃ film desired to provide the mesa-shaped regions of BaTiO₃. In particular, regions of the photo resist layer 58 which cover the areas of the BaTiO₃ desired to be ultimately removed from the wafer 48 are damaged with the UV light while the areas of the BaTiO₃ film 50 desired to be left intact upon the wafer 48 (so as to provide the desired mesa-shaped regions) are covered and thereby protected with a suitable masking material which is opaque to ultraviolet light. In the example described herein, the mask material is formed into circular pieces and positioned over the photo resist layer 58 to protect circular areas of the photo resist layer 58 which directly overlie the areas of the BaTiO₃ film desired to provide the mesa-shaped regions of BaTiO₃. Therefore, upon exposure of the masking material pieces and photo resist layer 58 to ultraviolet light, every region of the photo resist layer 58 left uncovered (i.e. unprotected) by the masking material pieces, is damaged by the ultraviolet light.

Figure 13:
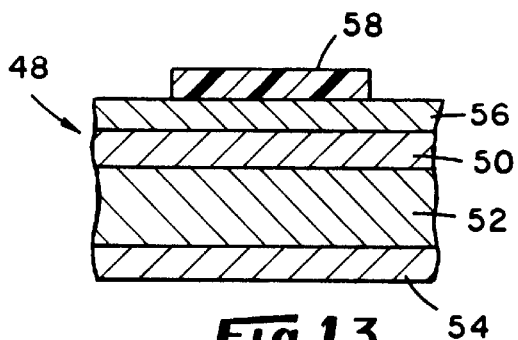

The photo resist layer 58 is then developed by exposing the layer 58 to an appropriate developing fluid, such as Shipley Product No. MF-322, available from Shipley Co. of Newton, Mass. By developing the photo resist layer 58 in this manner, the regions of the layer 58 which were damaged by the exposure to ultraviolet light in the preceding step is chemically etched away from the underlying aluminum film 56, leaving the circular regions of the photo resist layer 58 which directly overlie the areas of the $BaTiO_3$ film desired to provide the mesa-shaped regions of $BaTiO_3$ intact. Following development of the photo resist layer 58, the wafer 48, along with its remaining (undeveloped) circular regions of photo resist left intact atop the aluminum film 56, is baked at a temperature of between about 115 and 120° C. for about thirty minutes to harden the remaining photo resist regions. Following this baking step, a cross section of the wafer 48 taken through one of the remaining photo resist regions resembles that illustrated in FIG. 13.

Figure 14:
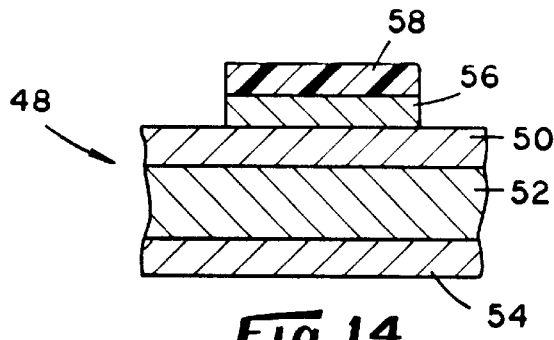

Then, an appropriate developer, such as Shipley MF-322, which does not harm the photo resist, is applied across the top of the wafer 48 to chemically etch all of the regions of the aluminum film 56 left exposed (i.e. uncovered) by the remaining circular regions of the photo resist. In other words, this developer etches away from the $BaTiO_3$ surface all of the aluminum which is left uncovered by the remaining circular regions of the photo resist so that the only aluminum left overlying the $BaTiO_3$ is that which underlies the remaining regions of the photo resist. Following this etching step, a cross section of the wafer 48 taken through one of the remaining photo resist regions resembles that illustrated in FIG. 14.

Figure 15:
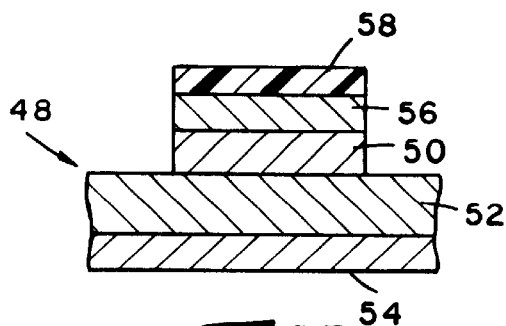

Then, the areas of the $BaTiO_3$ film 50 left exposed (i.e. uncovered) by the remaining photo resist regions are etched away from the surface of the silicon substrate 52 with an appropriate solution while leaving the photo resist (which still covers the desired circular mesa-shaped regions of the $BaTiO_3$ film) intact and unharmed. By way of example, such a $BaTiO_3$-etching solution may be comprised of 7:7:1/2:100 $HNO_3:HCl:HF:H_2O$. This exemplary solution achieves, etch rates of Al and $BaTiO_3$ that are substantially equal so that the desired mesa-shaped geometry of the remaining aluminum and $BaTiO_3$ is formed without undercuts disposed beneath the photo resist. Following this etching step, a cross section of the wafer 48 taken through one of the remaining photo resist regions resembles that illustrated in FIG. 15.

Figure 16:
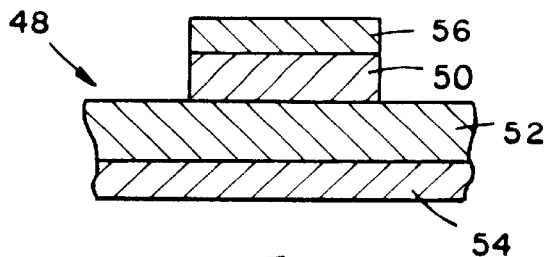

The remaining photo resist regions are subsequently removed by applying acetone over the wafer 48, and the resulting wafer 48 is annealed in air at about 215° C. for about ten minutes to relieve defects or dislocations in the remaining constituent layers of the wafer 48. Following the removal of the remaining photo resist regions, a cross section of the wafer 48 taken through one of the mesa-shaped formations of $BaTiO_3$ resembles that illustrated in FIG. 16.

While the aforedescribed method involving wet chemistry photolithography used for forming mesa-shaped formations of $BaTiO_3$ proved to be well-suited for applicants' purposes, it will be understood by those skilled in the art that other acceptable methods can be utilized. For example, such alternative methods include reactive ion etching and X-ray lithography. Moreover, additional steps may be incorporated within the aforedescribed wet chemistry method such as baking the resulting wafer for a period following each step.

It has been found that intermediate baking steps help to maintain the walls of the desired mesas in a near-perfect cylindrical shape.

Figure 17:
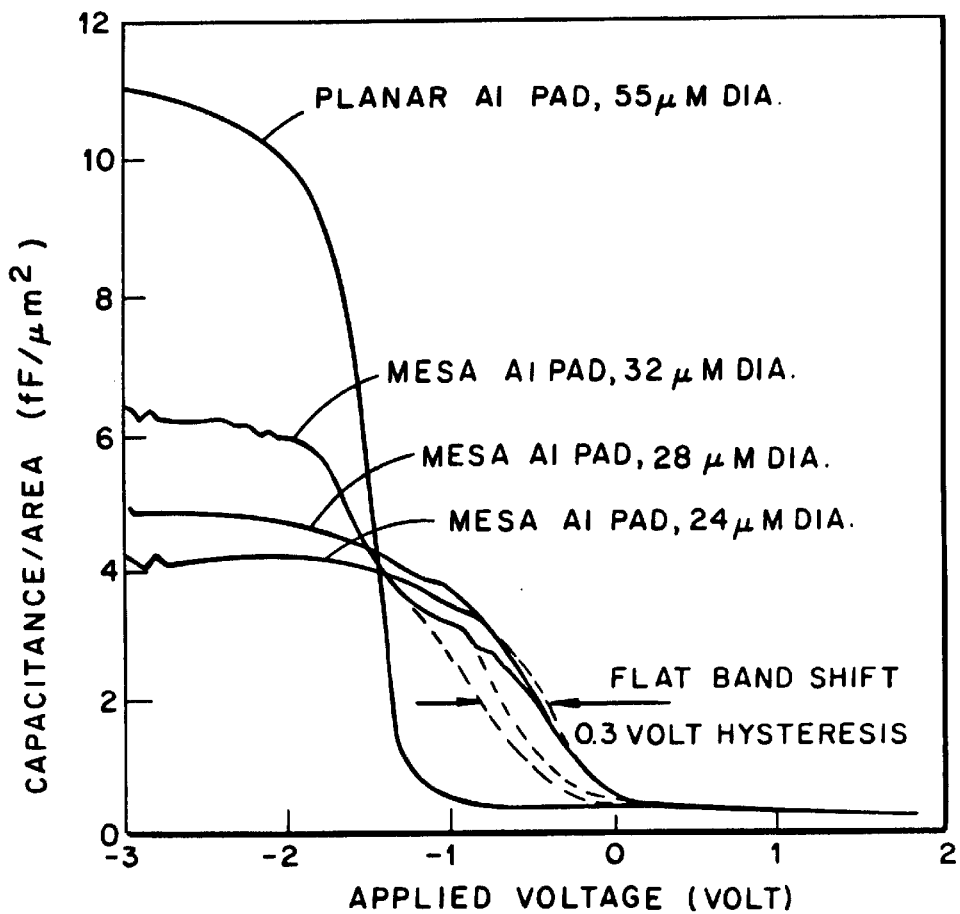
FIG. 17 is a graph plotting the test results obtained with the completed sample whose cross section is depicted in FIG. 16.

The results of tests performed with the resulting test wafer 48 are set forth in FIG. 17. It can be seen that with the exception of the mesa of $BaTiO_3$ having a width of 55 $\mu$m, each of the $BaTiO_3$ mesas were switched, i.e. poled out-of-plane, with the application of a voltage of between 0 and −1 volts.

Figure 18:
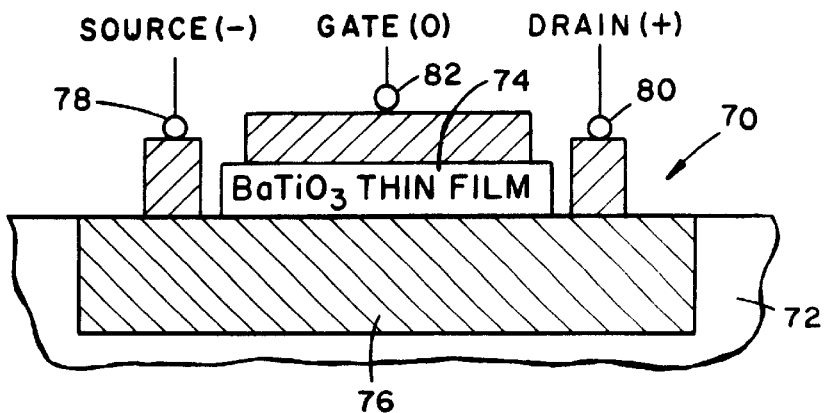
FIG. 18 is a schematic cross-sectional view of a fragment of a ferroelectric field effect transistor (FFET) utilizing a $BaTiO_3$ thin film as a gate dielectric.

It follows that since the $BaTiO_3$ mesas of the test wafer 48 can be poled out-of-plane with the application of an appropriate electric field between the top of each mesa and the underside of the silicon substrate, the polarization of the silicon disposed directly beneath the mesa can be switched, as well. In other words, by orienting the ferroelectric dipole normal to the silicon surface, interface charge compensation is induced within the silicon. It also follows that this concept can be incorporated within a ferroelectric field effect transistor (FFET) in a manner which takes appreciable advantage of the ferroelectric properties of the materials involved. For example and with reference to FIG. 18, there is shown an FFET, indicated 70, including a base, or substrate 72 of Si and a mesa-shaped overlayer 74 of the perovskite $BaTiO_3$ having a height which is no greater than about 250 angstroms. The transistor 70 is also provided with a source electrode 78, a drain electrode 80, and a gate electrode 82. Since the $BaTiO_3$ thin film (as do other ferroelectric materials) possesses a permanent spontaneous electric polarization (electric dipole moment per cubic centimeter) that can be reversed by an electric field, the ferroelectric dipoles of the $BaTiO_3$ mesa can be switched, or flipped, and the charge density and channel current (by the accumulation or depletion of charge in the silicon) can be modulated. Thus, the transistor 70 can be turned ON or OFF by the action of the ferroelectric polarization, and if used as a memory device, the transistor 70 can be used to read the stored information (+or −, or "1" or "0") without ever switching or resetting.

It follows from the foregoing that the ferroelectric characteristics of a thin film of $BaTiO_3$ on Si are affected by cooling the $BaTiO_3$/Si following deposition, but that these affects can be taken into account during the construction of such a structure to preferentially orient the electric dipoles of the $BaTiO_3$ substantially within the plane of the film. Furthermore, by controlling the geometry of the $BaTiO_3$ thin film so that the in-plane strain of the film, which is normally appreciable, is relieved to some extent by destroying the atomic bond between the $BaTiO_3$ film of one region from that of its surrounding region of $BaTiO_3$ film. With in-plane strain being relieved in the aforedescribed manner, the $BaTiO_3$ mesa can be poled out-of-plane thereby permitting the switching of the underlying silicon.

It also follows that the control of the geometry of the $BaTiO_3$ thin film atop silicon can be had by removing the $BaTiO_3$ film which surrounds a desired geometry by cutting or etching away of surrounding regions of the $BaTiO_3$ film from interior regions of $BaTiO_3$ film so that island-like mesas of $BaTiO_3$ film are disposed across the surface of the silicon substrate. In the alternative, mesa-shaped islands of $BaTiO_3$ having desired geometries can be formed atop a silicon substrate during the build-up of $BaTiO_3$ atop Si with the use of appropriate masking. Further still, defects can be induced by ion beam deposition techniques within a thin film build up of $BaTiO_3$ along the boundaries of selected regions of the $BaTiO_3$ film to relieve (by internal plane reversal) the in-plane strain within those regions. In this latter method, ion-beam implanted defects along the borders of the regions effect a change in the local volume and hence the in-plane strain within the BaTiO$_3$ film and may, if desired, induce an in-plane compressive state within the selected regions. In any event, within the method of this invention, steps are taken to effect a discontinuity in the in-plane mechanical restraint of the selected regions of the ferroelectric film so that the selected regions can be poled out of plane, thereby effecting a switch of the polarization of the underlying silicon.

It will be understood that numerous modifications and substitutions can be had to the aforedescribed embodiment without departing from the spirit of the invention. Accordingly, the aforedescribed embodiments are intended for the purpose of illustration and not as limitation.

We claim:

1. A crystalline structure comprising:
a semiconductor substrate having a surface;
a ferroelectric thin film overlying the surface of the substrate wherein the ferroelectric film provides, with the semiconductor substrate, a single crystal and the unit cells of the ferroelectric film are exposed to in-plane strain which predominately orients the dipole moments of the thin film in a plane which is parallel to the surface of the substrate, and wherein the ferroelectric thin film includes at least one region in which the in-plane strain is relieved to such an extent that the dipole moments of the unit cells are capable of being poled out-of-plane.

2. The structure as defined in claim 1 wherein the ferroelectric thin film consists of an ABO$_3$ material having at least one AO constituent plane and at least one BO$_2$ constituent plane and wherein the film is arranged upon the surface of the substrate so that a first single plane consisting of a single atomic layer of said AO constituent of the ABO$_3$ material overlies the surface of the substrate and a second single plane consisting of a single plane consisting of a single atomic layer of said BO$_2$ constituent of the ABO$_3$ material overlies the first single plane of AO.

3. A crystalline structure comprising:
a semiconductor substrate having a surface;
a ferroelectric thin film overlying the surface of the substrate and forming, with the substrate, a single crystal and wherein the ferroelectric film consists of an ABO$_3$ material having at least one AO constituent plane and at least one BO$_2$ constituent plane and wherein the film is arranged upon the surface of the substrate so that a first single plane consisting of a single atomic layer of said AO constituent of the ABO$_3$ material overlies the surface of the substrate and a second single plane consisting of a single plane consisting of a single atomic layer of said BO$_2$ constituent of the ABO$_3$ material overlies the first single plane of AO and the AO and BO$_2$ constituent planes form unit cells of the ABO$_3$ material; and
wherein the unit cells of the ferroelectric thin film are exposed to in-plane strain which predominately orients the dipole moments of the thin film in a plane which is arranged parallel to the surface of the substrate, and wherein the ferroelectric thin film includes at least one region in which the in-plane strain is relieved to such an extent that the dipole moments of the unit cells are capable of being poled out-of-plane.

4. The structure as defined in claim 3 wherein the in-plane strain within said at least one region of the ferroelectric film is an in-plane tensile strain.

5. The structure as defined in claim 4 wherein the ferroelectric film includes another region which borders said at least one region, and the in-plane mechanical restraint between said at least one region of the ferroelectric film and said another region of the film is discontinuous at the boundary therebetween.

6. The structure as defined in claim 4 wherein the geometry of said one region simulates that of a mesa having a width as measured across the substrate which is sufficiently small so that the in-plane tensile strain within said one region is relieved to the extent necessary to permit said one region to be poled out-of-plane.

7. A monolithic crystalline structure comprising:
a semiconductor substrate having a surface;
a ferroelectric thin film overlying the surface of the substrate and providing, with the substrate, a single crystal and wherein the ferroelectric thin film consists of an ABO$_3$ material having at least one AO constituent plane and at least one BO$_2$ constituent plane and wherein the thin film is arranged upon the surface of the substrate so that a first single plane consisting of a single atomic layer of said AO constituent of the ABO$_3$ material overlies the surface of the substrate and a second single plane consisting of a single plane consisting of a single atomic layer of said BO$_2$ constituent of the ABO$_3$ material overlies the first single plane of AO and AO and BO$_2$ constituent planes form unit cells of the ABO$_3$ material; and
the unit cells of the ferroelectric thin film are exposed to in-plane strain which effects the shape of the unit cells so that the dipole moments of the thin film are predominately oriented in a plane which is parallel to the surface of the substrate; and
wherein the geometry of the ferroelectric thin film simulates that of a mesa situated upon the substrate wherein the width of the mesa as measured across the substrate is sufficiently small so that the in-plane tensile strain within the ferroelectric thin film is relieved to the extent necessary to permit the dipole moments of the ferroelectric thin film to be poled out-of-plane.

8. The structure as defined in claim 7 wherein the mesa-shaped geometry of the ferroelectric film is a first mesa-shaped geometry situated upon the substrate surface, and the structure further includes a second mesa-shaped geometry comprised of a ferroelectric film situated upon the substrate surface, and the in-plane mechanical restraint between the first and second mesa-shaped geometries is discontinuous.

9. The structure as defined in claim 8 wherein the first and second mesa-shaped geometries are spaced from one another as a path is traced across the surface of the substrate.

10. The structure as defined in claim 7 therein the semiconductor substrate is comprised of silicon and the ferroelectric film is comprised of BaTiO$_3$.

11. A monolithic crystalline structure comprising:
a substrate having a surface defined by (001) silicon;
at least one mesa disposed across the surface of the silicon wherein at least one mesa is comprised of a ferroelectric thin film overlying the surface of the silicon and providing, with the substrate, a single crystal and wherein the ferroelectric thin film consists of an ABO$_3$ material having at least one AO constituent plane and at least one BO$_2$ constituent plane and wherein the thin film is arranged upon the surface of the silicon so that a first single plane consisting of a single atomic layer of said AO constituent of the ABO$_3$ material overlies and is commensurate with the surface of the silicon and a second single plane consisting of a single plane consisting of a single atomic layer of said BO$_2$ constituent of the $ABO_3$ material overlies and is substantially commensurate with the first single plane of AO and the AO and $BO_2$ constituent planes form unit cells of the $ABO_3$ material; and the unit cells of the ferroelectric thin film are exposed to in-plane strain which effects the shape of the unit cells so that the dipole moments of the thin film are predominately oriented in a plane which is parallel to the surface of the substrate; and wherein the at least one mesa has a width as measured thereacross which is sufficiently small so that in-plane tensile strain within the ferroelectric thin film is relieved to the extent necessary to permit the dipole moments of the ferroelectric material of the at least one mesa to be poled out-of-plane.

12. The structure as defined in claim 11 wherein the mesas are spaced from one another as a path is traced across the surface of the substrate.

13. The structure as defined in claim 11 wherein the ferroelectric film is comprised of $BaTiO_3$.

14. A process for treating a ferroelectric thin film situated directly atop the surface of a semiconductor wherein the thin film provides, with the semiconductor, a single crystal and wherein the unit cells of the thin film are exposed to in-plane tensile strain which influences the shape of the unit cells so that the dipole moments of the thin film are predominately disposed in a plane which is parallel to the semiconductor substrate and thereby prevented from being poled out-of-plane, wherein the process comprises the steps of:

selecting a region of the ferroelectric thin film; and effecting the continuity of the mechanical restraint adjacent the boundary of the preselected region to relieve the in-plane tensile strain within the preselected region so that the preselected film region can be poled out-of-plane.

15. The process as defined in claim 14 wherein the effecting step is carried out with ion beam deposition techniques involving the deposition of ions within the ferroelectric thin film adjacent the boundary of the preselected region.

16. The process as defined in claim 14 wherein the preselected region of the ferroelectric thin film is surrounded by a surrounding region of the thin film, and the effecting step is carried out by removing material of the ferroelectric thin film adjacent the boundary of the preselected region so that the preselected region of the thin film is separated from the surrounding region.

17. A process for forming a ferroelectric thin film into a mesa-shaped geometry situated directly atop a semiconductor surface comprising the steps of:

providing a crystalline structure including a semiconductor substrate having a surface and a ferroelectric film directly overlying the semiconductor substrate wherein the ferroelectric thin film provides, with the semiconductor, a single crystal and wherein the unit cells of the thin film are exposed to in-plane tensile strain which influences the shape of the unit cells so that the dipole moments of the thin film are predominately disposed in a plane which is parallel to the semiconductor substrate and thereby prevented from being poled out-of-plane;

effecting the atomic bonds between the thin film material disposed adjacent the boundary of the region of the thin film desired to form the mesa-shaped geometry atop the substrate and the thin film material disposed outboard of said boundary to relieve the in-plane tensile strain within the thin film material desired to form the mesa-shaped geometry so that the thin film material within the mesa-shaped geometry can be poled out-of-plane.

18. The process as defined in claim 17 wherein the film providing the crystalline structure includes a semiconductor substrate having a surface and a ferroelectric film directly overlying the semiconductor substrate wherein the film has superposed atomic layers which are substantially commensurate with the surface of the substrate;

the step of effecting involves the eliminating of the in-plane mechanical restraint between the film material disposed adjacent the boundary of the region of the film desired to form the mesa-shaped geometry atop the substrate and the film material disposed outboard of said boundary to thereby relieve the in-plane tensile strain within the film region desired to form the mesa-shaped geometry for a depth which generally corresponds to the height of the ferroelectric film.

19. The process as defined in claim 18 wherein the step of eliminating the in-plane mechanical restraint includes the step of removing material of the ferroelectric film from the boundary of the region desired to remain as a mesa-shaped geometry atop the substrate surface.

20. The method as defined in claim 19 wherein the removing step is effected by wet chemistry photolithography.

21. A process for growing a ferroelectric thin film atop a semiconductor surface so that the geometry of the ferroelectric thin film resembles that of a mesa situated atop the semiconductor surface, the process comprising the steps of:

providing a semiconductor substrate having a surface;

covering areas of the surface of the semiconductor substrate upon which no ferroelectric thin film is desired to be grown directly thereupon, the covered areas of the semiconductor surface being shaped so that a region of the substrate surface left uncovered by this step corresponds with the desired cross-sectional shape of the mesa-shaped geometry of the ferroelectric thin film;

growing a ferroelectric thin film upon the entire semiconductor surface so that the grown thin film directly contacts the surface of the semiconductor substrate in the regions thereof left uncovered by the covering step and wherein the ferroelectric thin film provides, with the semiconductor substrate, a single crystal and wherein the unit cells of the thin film are exposed to in-plane tensile strain which affects the shape of the unit cells so that the dipole moments of the thin film are predominately disposed in a plane which is parallel to the semiconductor substrate yet the in-plane strain within the thin film is relieved to such an extent that the dipole moments of the unit cells are capable of being poled out-of-plane; and uncovering the covered areas of the substrate surface so that the only ferroelectric film which remains atop the substrate surface is that which directly contacts the surface of the substrate surface.

* * * * *